United States Patent [19]

Beneking

[11] 4,254,430
[45] Mar. 3, 1981

[54] SEMI-CONDUCTOR ARRANGEMENT

[75] Inventor: Heinz Beneking, Aachen, Fed. Rep. of Germany

[73] Assignee: Licentia Patent-Verwaltungs-G.m.b.H., Frankfurt am Main, Fed. Rep. of Germany

[21] Appl. No.: 7,615

[22] Filed: Jan. 29, 1979

[30] Foreign Application Priority Data

Feb. 1, 1978 [DE] Fed. Rep. of Germany ....... 2804165

[51] Int. Cl.³ ........................................... H01L 29/80
[52] U.S. Cl. ..................................... 357/22; 357/23; 357/36; 357/46; 357/56

[58] Field of Search ...................... 357/22, 23, 36, 46, 357/56

[56] References Cited

U.S. PATENT DOCUMENTS 3,828,230  8/1974  Nishizawa et al. ..................... 357/22
3,829,883  8/1974  Bate ........................................ 357/36

Primary Examiner—Edward J. Wojciechowicz
Attorney, Agent, or Firm—Spencer & Kaye

[57] ABSTRACT

A semi-conductor arrangement comprises a current carrying channel associated with at least two drain electrodes, means being provided for exerting transverse control on the current in the channel to selectively trigger one of the drain electrodes.

15 Claims, 4 Drawing Figures

SEMI-CONDUCTOR ARRANGEMENT

BACKGROUND OF THE INVENTION

The invention relates to a semi-conductor arrangement having a channel suitable for carrying current and having a source electrode. Field effect transistors are known in which the current carried by the channel region between a source and a drain electrode is changed with the aid of a gate control voltage. Thus the change in current in the channel is caused by the fact that the channel cross-section is restricted or broadened by varying the space charge region starting from the gate contact. This is true for the so-called MOS or MIS field effect transistors in which the channel region is covered by an insulating layer on which the gate contact is arranged. In the case of self-conducting MOS or MIS-field effect transistors, a current channel is present even in the case where there is no gate voltage and this current channel can be constricted by an appropriate potential at the gate connection. In the case of self-blocking MOS or MIS field effect transistors, the channel is only produced, when applying a gate voltage or suitable polarity, by means of inversion. Furthermore, blocking layer field effect transistors are to be mentioned in which a blocking layer comprising a pn junction or a Schottky contact borders the channel region. The space charge region starting from this blocking layer in the case of a potential at the gate electrode which has been applied accordingly serves to control the current flowing between the source and the drain electrodes.

SUMMARY OF THE INVENTION

It is an object of the present invention to provide a control arrangement for a channel current in which the cross-section of the current carrying channel is not primarily changed, but rather a transverse deflection of the carrier current is to be made possible without magnetic fields being used to achieve this.

According to a first aspect of the invention, there is provided a semi-conductor arrangement comprising a current carrying channel, at least two drain electrodes associated with said channel and means for exerting transverse control on the current in said channel to selectively trigger one of said drain electrodes.

According to a further aspect of the invention, there is provided a semi-conductor arrangement having a channel which is suitable for carrying currents and a source electrode characterized in that at least two drain electrodes are associated with the current carrying channel and that the width of said current carrying channel is dimensioned such that a transverse control of the carrier current and thus a deliberate triggering of different ones of said drain electrodes is possible by shifting the minimum point of a potential distribution running in the channel transverse to the carrier flow.

BRIEF DESCRIPTION OF THE DRAWINGS

The invention will now be described in greater detail by way of example, with reference to the drawings, in which.

DESCRIPTION OF THE PREFERRED EMBODIMENT

Figure 1:
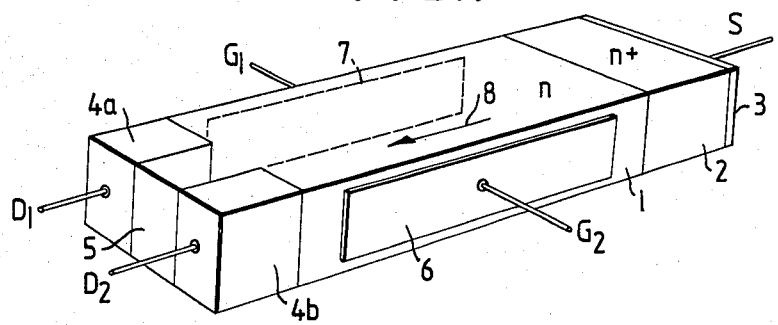
FIG. 1 is a perspective view of a semi-conductor arrangement in accordance with the invention.

The control arrangement on which the invention is based is intended to be capable of being used at very high frequencies for the purpose of signal processing and for the purpose of amplification. In a preferred form of the invention, a semi-conductor arrangement is proposed having a current carrying channel in which at least two drain electrodes are associated with the current carrying channel and in which the width of the current carrying channel is such that a transverse control of the carrier current and thus a deliberate triggering of the different drain electrodes is possible by shifting the minimum points of a potential distribution running in the channel transverse to the carrier flow.

In the case of this control mechanism, the fact that the charge carriers flowing in the channel are carried in the channel at the minimum point of the trough in the presence of a trough in potential is utilized. By applying suitable potentials, this trough in potential can be displaced transverse to the direction of propogation of the carrier current, whereby a deflection in the carrier flow is made possible. The trough in potential arises as a result of superimposing the potential curves which start from the edge layers bordering the channel region. The current carrying channel therefore lies between at least two edge layers from which a potential curve, extending in each case into the channel region, starts in the currentless condition for the purpose of forming the thermal equilibrium. The edge layers are formed by rectifying Schottky contacts, by pn junctions or by semi-conductor insulator junctions. Connecting contacts are arranged at the outer region bordering the edge layers, these regions comprising the Schottky metal contact, a semi-conductor region having the opposite type of conduction to the channel or comprising insulating layers with connecting contacts, to which the control voltages or bias voltages can be applied. If the edge layer consists of a Schottky metal contact then the connecting contact can be identical to the metal forming the Schottky contact.

The spacing between the edge layers or the space charge regions starting there must be dimensioned so that a trough shaped potential curve is formed having a defined minimum point by superimposing the potential curves in the current carrying channel transverse to the carrier flow. This means that the minimum point must be limited to a small region of the channel cross-section. The said condition is fulfilled if the width of the current carrying channel is smaller than approximately 10 Debye lengths transverse to the carrier flow.

In the case of the control principle in accordance with the invention, there are no longer any propogation time effects in the current carrying channel region but rather the relaxation time, which is smaller than the propogation time in the case of the control mechanism previously used, is decisive for the frequency behaviour of the control processes. The control mechanism described can be carried out more particularly in the case of weakly doped and therefore highly resistive channel material, whereby it should be taken into account however, that the relaxation time also increases with the resistance of the channel material. The channel is preferably n-doped and has an impurity concentration of between $10^{15}$ and $10^{16}$ atoms/cm$^3$. The unipolar carrier current thus comprises electrons.

The control principle in accordance with the invention can also be used to produce a quadrupole i.e. a carrier current which can be deflected two-dimensionally. For this purpose the channel is arranged between four edge layers having associated control contacts whereby the direction of displacement which can be achieved by means of one edge layer pair for the carrier current deviates from the direction of displacement which can be achieved by the other edge layer pair, so that any desired displacement in the cross-sectional plane of the channel is possible. The directions of displacement are preferably approximately perpendicular to each other. The channel end is provided with a plurality of drain electrodes in the case of this type of quadrupole, preferably in a plane perpendicular to the direction of propogation of the carrier current, so that by selecting the potential at the different edge layers, a defined drain electrode can be triggered. In order to produce a micro display, the drain electrodes can be replaced by light emitting regions.

Referring now to the drawings, the semiconductor body 1 in accordance with FIG. 1 comprises n-conductive silicon for example having an impurity concentration of $10^{15}$ to $10^{16}$ atoms/cm$^3$. The semiconductor body is elongate and has a rectangular cross-section. The n+ conductive source electrode 2 is located at one end and is provided with a metal connecting contact 3. The outer connection of the source electrode is designated "S". At the other end of the elongate semi-conductor body are located the drain electrodes 4a and 4b which are n+ conductive too for example, and are separated from each other by means of a high resistance portion 5 of the body 1. These drain electrodes 4a and 4b are also provided with metal connecting contacts and have outer connections $D_1$ and $D_2$. The current carrying channel in which the carrier current 8 flows in the direction of the arrow is located between the source electrode 2 and the drain electrodes 4a and 4b. The channel is located between two edge layers 6 and 7 which comprise rectifying metal semiconductor junctions, for example. The related metal contacts at the same time form the outer connections at the edge layers. In FIG. 1 the outer supply lines to these metal contacts are designated $G_1$ and $G_2$. The metal contacts 6 and 7 are located on opposite sides of the channel which has a rectangular cross-section.

Figure 2:
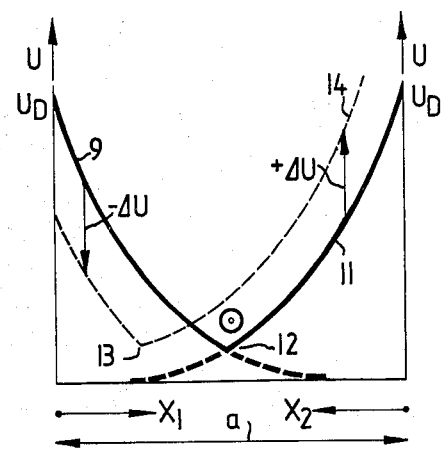
FIG. 2 is a graphical illustration of the potential distribution in the channel area of a semi-conductor arrangement such as that shown in FIG. 1.

In the currentless condition, a potential distribution is already formed transverse to the direction of carrier current flow 8 by superimposition in accordance with FIG. 2. This potential curve arising from setting the thermal equilibrium is shown in FIG. 2. The channel width between the edge layers 6 and 7 is designated a. A potential curve 9 starts from one edge layer 7 and is superimposed on the potential curve 11 starting from the edge layer 6. Directly at the edge layers the diffusion voltage $U_D$ is present. The distances from the edge layers 7 and 6 respectively are designated $x_1$ and $x_2$. Both potential curves 9 and 11 meet at the minimum point 12 which is limited in its location and the charge carriers of the carrier current collect at this minimum point. If, for example, the voltage $U_D$ is increased by the amount $\Delta_U$ at the edge layer 6 by supplying an external potential and if the voltage at the edge layer 7 is also lowered by the amount $\Delta_U$ by supplying an external potential, then the shown minimum point 13 of the resultant potential curve 14 is displaced towards the left whereby the carrier current is also displaced towards the left, since the charge carriers attempt, as previously, to collect at the minimum point of the potential curve. In an appropriate manner, the resultant potential curve and thus the minimum point of the potential curve can also be displaced transversely to the carrier flow towards the right so that for example the drain electrodes $D_1$ and $D_2$ in accordance with FIG. 1 can be deliberately triggered. There is also the possibility of changing the potential only at one edge layer, while the other edge layer is left at flowing potential.

Expanding the potential trough such that a defined and locally limited point is formed is determined by the Debye length of the material and in fact the drop from the maximum point to the minimum point of the voltage extends over approximately 3 Debye lengths. This characteristic length is formed as follows:

$$L_D = \sqrt{\frac{kT \cdot \epsilon}{q^2 n}}$$

in which;

$$\frac{k \cdot T}{q}$$

is the temperature voltage $U_T$.

q is the elementary charge.

$\epsilon$ is the dielectric constant of the material and:

n is the doping of the channel region.

With channel doping of $10^{16}$ atoms/cm$^3$ for example, $L_D = 0.04$ μm. The order of magnitude of the Debye length determines the transverse dimensions of the channel region in which the minimum point of potential curve is to be displaced by triggering an effective control. These transverse dimensions should preferably be smaller than 10 Debye lengths so that, with channel doping of $10^{16}$ atoms/cm$^3$, the channel may only be approximately 0.4 μm wide.

Figure 3:
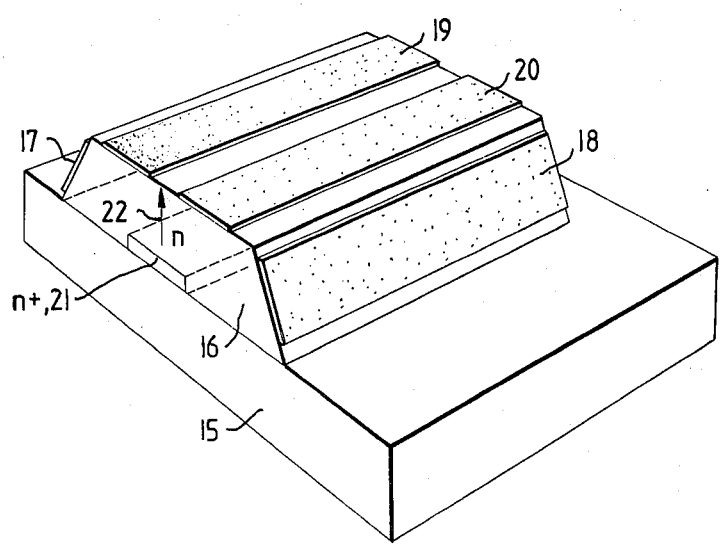
FIG. 3 is a perspective view of a second form of semi-conductor arrangement according to the invention.

A practicable embodiment of this type of arrangement is shown in FIG. 3. A mesa-shaped semi-conductor region 16 is located on a base element 15, with the region 16 being n-doped and being the channel region which can be controlled. The source region 21 is n+-doped and is located between the mesa-shaped region 16 and the base element 15 in the form of a buried layer. The mesa projection is covered, for example, by means of two drain connecting contacts 19 and 20 which have the shape of narrow elongate strips which are parallel to each other. The flanks of the mesa projection are covered for example by metal Schottky contacts 17 and 18 which are constructed for example also as elongate metal strips. The length of the mesashaped region 16 in the direction of expansion of the connecting contacts is not critical since the direction of flow of the carrier current 22 is perpendicular to this direction of expansion and is between the source electrode 21 and the drain contacts 19 and 20. Only the width of the mesa-shaped projection 16 is critical; and this should not preferably exceed the value of 10 Debye lengths.

In wider channels, transverse deflection is of course possible if direct voltage potentials of the same polarity are applied to both edge layers, these direct voltage potentials producing space charge regions extending into the channel between the edge layers, without the channel being completely constricted. These direct voltage potentials are then selected such that, between the space charge regions, a current carrying channel remains with a width, in which a trough-shaped potential curve with a defined minimum point arises. Then an alternating voltage signal potential is superimposed in contra-phase onto the direct voltage potential prevailing at the two edge layers, the alternating voltage potential pushing the minimum point of the trough-shaped potential curve backwards and forwards, transverse to the carrier flow at the signal frequency, and thus the drain contacts present are triggered alternately. In this case it is not necessary to restrict the width of the channel to a few Debye lengths. This regulation of dimensioning is only valid for a channel cross-section carrying current and remaining between the space charge regions.

Figure 4:
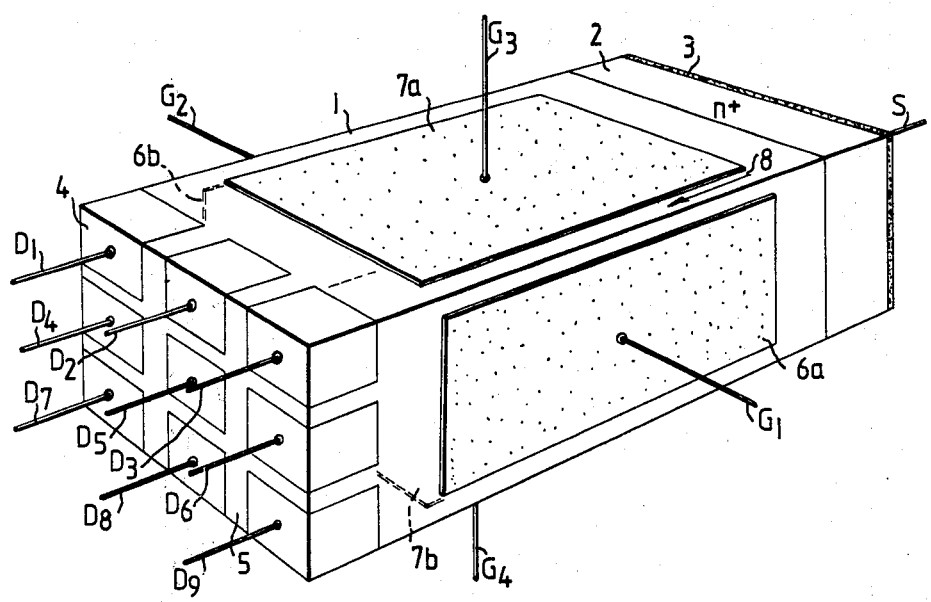
FIG. 4 is a perspective view of a third form of semi-conductor arrangement according to the invention.

In FIG. 4 the general construction of a quadrupole is shown. The semi-conductor body 1 in turn has a rectangular cross-section and comprises an elongate semi-conductor region having a relatively weak doping. An edge layer which is formed, for example, by means of rectifying metal semi-conductor junctions is located on each of the four longitudinal sides of the semi-conductor body. The Schottky contacts are designated 6a, 6b and 7a, 7b in FIG. 4. The directions of displacement for the carrier current 8 can be produced with the two edge layer pairs 6a and 6b and 7a and 7b by displacing the respective minimum point of the potential between the two edge layers, these layers running essentially perpendicular to each other so that the carrier current 8 can be displaced almost as desired in the plane which runs perpendicular to its direction of expansion. One end face of the semi-conductor body therefore has a plurality of drain electrodes 4 which are provided in each case with an outer connnection $D_1$ to $D_9$. Depending on the potential ratios at the four control electrodes $G_1$, $G_2$, $G_3$ or $G_4$, one of the drain electrodes present is triggered. Therefore it can be seen easily that with the semi-conductor arrangement shown in FIG. 4, a micro-display can be constructed if the drain electrodes are replaced by light emitting regions so that in this way a micro-television screen can be produced for example. In an arrangement in accordance with FIG. 4, however, the regulation regarding dimensioning mentioned in many cases must be met both with respect to the spacing between the edge layers 6a and 6b and with respect to the spacing between the edge layers 7a and 7b.

It has already been pointed out that the rectifying metal semi-conductor contacts can be replaced by pn junctions. With the aid of the arrangements in accordance with the invention, a switch function can be effected, by means of which any desired circuits can be switched on or switched off. Furthermore, an external current source can be periodically switched if the direct voltage ratio at the control electrodes are superimposed by means of an alternating current signal. The edge layers can be provided with initial voltage potentials in order to effect a particular starting condition or in order to bring the current carrying channel region in which the minimum point of potential is to be displaced to the required point by setting the space charge region.

It will be understood that the above description of the present invention is susceptible to various modification changes and adaptations.

What is claimed is:

1. In a semi-conductor field effect device including a semi-conductor body of a first conductivity type having a source region and a plurality of drain regions formed therein so as to define a current carrying channel region between said source and said drain regions, the improvement comprising means, including at least two edge layers disposed on opposite sides of said channel region, for producing a trough shaped potential curve having a defined minimum point in said current carrying channel in a direction transverse to the direction of carrier flow by superposition of potential curve emanating from said edge layers, whereby triggering of a selected one of said drain regions is possible by shifting said minimum point of said potential curve in said direction transverse to said carrier flow.

2. A semi-conductor device as defined in claim 1, wherein said at least two edge layers produce potential curves which extend into the channel region in the currentless condition for the purpose of forming thermal equilibrium.

3. A semi-conductor device as defined in claim 2, wherein said edge layers comprise rectifying metal semi-conductor junctions, pn junctions or semi-conductor insulator junctions.

4. A semi-conductor device as defined in claim 2 and including outer regions bordering said edge layers comprising Schottky metal contacts, semiconductor regions of the opposite type of conduction to said regions or insulating layers having connecting contacts for supplying control and bias voltages.

5. A semi-conductor device as defined in claim 2, wherein the width of said channel region between said edge layers or the space charge regions starting from them is such that said trough shaped potential curve having a defined minimum point is produced by superimposition of said potential curves produced by said edge layers in the currentless state in said current carrying channel transverse to said direction of said carrier flow.

6. A semi-conductor device as defined in claim 5, wherein said width of said current carrying channel is less than 10 Deybe lengths in said direction transverse to the carrier flow.

7. A semi-conductor device as defined in claim 1, wherein said channel region is n doped and has an impurity concentration of $10^{15}$ to $10^{16}$ atoms/cm$^3$.

8. A semi-conductor device as defined in claim 1, wherein said channel region is located between two pairs of said oppositely disposed edge layers each having exterior control contacts which are arranged such that the direction of displacement for the carrier current produced by one pair of said edge layers deviates from the direction of displacement which can be achieved by the other pair of said edge layers.

9. A semi-conductor device as defined in claim 8, wherein said plurality of drain regions are arranged at the end of said channel in a plane perpendicular to the direction of propagation of the carrier current.

10. A semi-conductor device as defined in claim 9, wherein said drain regions comprise light emitting regions for producing a micro display.

11. A semi-conductor device as defined in claim 8, wherein the directions of displacement of said carrier current by said two edge layer pairs run approximately perpendicular to each other.

12. A semi-conductor device as defined in claim 1, wherein said means for producing further includes means for supplying direct voltage potentials of the same polarity to both said edge layers to produce space charge regions extending into said channel region between said edge layers and with said direct voltage potentials being selected such that said space charge regions will not completely constrict said channel region and so that a current carrying channel having a width, in which said trough shaped potential curve having said defined minimum point occurs, remains between said space charge regions; and further comprising means for superimposing an alternating voltage signal potential onto the direct voltage potential prevailing at said two edge layers in contra phase so that the minimum point of said trough shaped potential curve is pushed backwards and forwards transversely to the direction of said carrier current at the signal frequency by said alternating voltage signals potential and said drain regions are triggered alternately.

13. A semi-conductor device as defined in claim 1 wherein said means for producing further includes means for applying selected direct voltage potentials to said edge layers to produce said potential curves emanating from said edge layers.

14. A semi-conductor device as defined in claim 1 further including means for applying selected potentials to said edge layers for shifting and minimum point of said potential curve in said direction transverse to said carrier flow to trigger selective ones of said drain regions.

15. A semi-conductor device as defined in claim 1 wherein said plurality of drain regions are disposed in a plane perpendicular to the direction of propagation of said carrier current, and parallel to the plane of said trough shaped potential curve.

* * * * *